United States Patent
Anzures et al.

(10) Patent No.: US 7,632,621 B2
(45) Date of Patent: Dec. 15, 2009

(54) MASK

(75) Inventors: Edgardo Anzures, Westborough, MA (US); Robert K. Barr, Shrewsbury, MA (US); Thomas C. Sutter, Holden, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 695 days.

(21) Appl. No.: 11/020,871

(22) Filed: Dec. 23, 2004

(65) Prior Publication Data

US 2005/0164121 A1 Jul. 28, 2005

Related U.S. Application Data

(60) Provisional application No. 60/532,379, filed on Dec. 24, 2003.

(51) Int. Cl.
*G03F 7/00* (2006.01)
*G03F 7/004* (2006.01)

(52) U.S. Cl. ............... 430/270.1; 430/273.1; 430/281.1

(58) Field of Classification Search ............ 430/273.1, 430/270.1, 281.1
See application file for complete search history.

(56) References Cited

U.S. PATENT DOCUMENTS

| | | | |
|---|---|---|---|
| 4,247,616 A * | 1/1981 | Vikesland et al. | 430/192 |
| 4,621,043 A * | 11/1986 | Gervay | 430/281.1 |
| 4,721,531 A | 1/1988 | Wildeman et al. | |
| 4,777,115 A * | 10/1988 | Koch et al. | 430/281.1 |
| 5,106,891 A | 4/1992 | Valet | |
| 5,229,252 A | 7/1993 | Flynn et al. | |
| 5,254,608 A | 10/1993 | McClure | |
| 5,298,364 A * | 3/1994 | Pawlowski et al. | 430/280.1 |
| 5,332,648 A * | 7/1994 | Kihara et al. | 430/270.1 |
| 5,495,803 A | 3/1996 | Gerber et al. | |
| 5,779,779 A | 7/1998 | Jolly | |
| 5,820,932 A | 10/1998 | Hallman et al. | |
| 5,869,030 A | 2/1999 | Dumler et al. | |
| 5,891,228 A | 4/1999 | Baker et al. | |
| 5,938,826 A | 8/1999 | Baker et al. | |
| 6,093,239 A | 7/2000 | Baker et al. | |
| 6,113,678 A | 9/2000 | Malhotra | |
| 6,156,108 A | 12/2000 | Wachowiak, Jr. | |
| 6,162,842 A * | 12/2000 | Freche et al. | 522/120 |
| 6,187,380 B1 | 2/2001 | Hallman et al. | |
| 6,207,727 B1 * | 3/2001 | Beck et al. | 522/64 |
| 6,296,674 B1 | 10/2001 | Trainor et al. | |
| 6,342,094 B1 | 1/2002 | Kabalnov | |
| 6,413,700 B1 | 7/2002 | Hallman et al. | |
| 6,541,590 B1 | 4/2003 | Johnson et al. | |
| 6,754,551 B1 * | 6/2004 | Zohar et al. | 700/121 |
| 6,872,320 B2 | 3/2005 | Wong et al. | |

FOREIGN PATENT DOCUMENTS

| | | |
|---|---|---|
| EP | 1 333 071 A2 | 8/2003 |
| GB | 2 315 076 | 1/1998 |
| JP | 2571855 | 5/1991 |
| WO | WO 98/51750 | 11/1998 |
| WO | WO 02/090117 A1 | 5/2002 |

\* cited by examiner

*Primary Examiner*—Amanda C. Walke
(74) *Attorney, Agent, or Firm*—John J. Piskorski

(57) ABSTRACT

A mask is described for forming an image on a substrate. The mask may be selectively applied to a radiant energy sensitive material on the substrate. Actinic radiation applied to the composite chemically changes portions of the radiant energy sensitive material not covered by the mask. The mask and portions of the radiant energy sensitive material are removed using a suitable aqueous base developer. The mask is composed of aqueous base soluble or dispersible polymers and light-blocking agents.

11 Claims, No Drawings

MASK

CROSS-REFERENCE TO RELATED APPLICATIONS

This application claims the benefit under 35 U.S.C. § 119(e) of U.S. Provisional Application No. 60/532,379, filed Dec. 24, 2003, the entire contents of which are incorporated herein by reference.

BACKGROUND OF THE INVENTION

The present invention is directed to a composition for blocking light and a method of using the composition. More specifically, the present invention is directed to a composition for blocking light, which is dispersible or soluble in aqueous base, retains its shape after application and may be used to form an image on a substrate.

Methods of forming images on substrates encompass various industries such as the electronics, graphic arts and textile industries. Forming images typically involves lithography or photolithography. For example printed fabric labels may be made using a variety of techniques, such as screen printing, offset lithography printing, dyeing, flexographic printing, in-plant printing, and transfer printing. Such labels are suitable for garments for the purpose of decoration, identification, advertising, wash and care instructions, size, price, as well as other purposes.

Screen printing, also known as silk screen, employs a porous stencil mounted on a screen, in which the non-printing areas are protected by the stencil. The masking material also may be dried lacquer, shellac or glue. Printing is done on a mechanized press by feeding cloth under the screen, applying ink with a paint-like consistency to the screen, and spreading and forcing it through the fine mesh openings with a squeegee.

In offset lithography methods, the image and non-image areas are essentially on the same plane of the surface of a thin metal plate, the definition between them being maintained chemically. The ink is picked up by the hydrophobic areas on the plate but is not picked up by the hydrophilic areas. The image is then transferred to an offset rubber roll, then from the roll to the fabric sheet.

Flexographic printing is a form of rotary letterpress using flexible rubber plates and fast-drying fluid inks. The rubber plates utilize the relief method for image creation, where the image area is raised above the non-image areas. Ink rollers only touch the top surface of the raised area. The surrounding, non-printing, areas are lower and do not receive ink. The inked image is transferred directly to a cloth. Dyeing can be achieved by using dyestuffs rather than pigmented inks in any of the printing processes described above. The use of dyes, however, requires additional after treatments to fix the dye in the fabric.

In the electronics industry images are formed on substrates for the formation of circuitry by photolithography. This involves the use of a radiant energy sensitive material, such as photosensitive material, that is applied to a surface as a whole area coating (spin-casting, roller coating, spray and screen printing, and dipping) or as a whole area sheet (lamination). The material is applied in a light controlled laboratory in order to ensure that the photosensitive material is not pre-exposed prior to introducing the required pattern mask in front of the coated wafer or copper panels. The mask can be either a contact mask, a proximity mask or a projection mask. In all cases the mask is manufactured as a discrete unit to a high precision and is carefully protected against damage or dust/particulate collection. Once the mask is put in place then a lamp, of a radiation material matched to a photoinitiator used in the photosensitive material, may be used to expose the substrate coating in those areas not protected by the mask. Depending upon the photosensitive material type employed the pattern transfer achieved may be either positive or negative with respect to the mask. After exposure the photosensitive material is exposed to a developing chemical that modifies the chemistry of the coating in such a manner as to permit the untreated material to be washed away in a water-based dip bath or conveyor shower/spray.

Although spin-cast, dip, roller coating, spray and screen printing, or sheet lamination photolithographic methods of achieving a surface relief image are successful, they do have a number of problems such as material wastage (because of whole area technique), selective 3-D patterning is difficult and time consuming, chemistry used in photosensitive material has a high toxicity rating, disposability of large volumes of toxic and developing chemicals, and simple patterning is a multiple step process such as photocoating, mask alignment, radiation exposure, mask removal, pattern development, excess material rinse removal, and substrate drying.

One or more of these problems may be addressed by introducing further processes that can provide a patterned relief structure on a surface, including stenciling (screen printing), microdot transfer (stamping), and laser writing-etching (includes ablation scribing and direct-write photolithography equivalent imaging). Each technique has its merits and limitations which are driven by the detail of the intended application such as speed pattern generations, relief pattern thickness, controlled etch capability, cost of process and ease of use process. However, any one process does not address all of the problems cited above.

U.S. Pat. No. 6,093,239 discloses hot melt inks, which may be used to form a mark on a substrate, such as in printing screen manufacturing processes. The patent discloses that the inks are at least 50% water auto-dispersible. The inks contain waxes or resins, colorants, stabilizers and may be applied using an ink jet apparatus. The patent discloses that the inks are solid at room temperature and liquid at temperatures above room temperature. The patent also discloses that the inks may be readily removed from a substrate with water after imaging is completed. However, the water auto-dispersibility of the inks is one disadvantage. Such inks are not suitable for use in humid environments such as may be found in many manufacturing plants. Such inks may readily become too fluid due to moisture absorption for proper application.

Many methods used in the manufacture of electronic devices require selective application of a photosensitive material, which is then used to enable subsequent steps of the overall manufacturing process. For example, solder mask is excluded from through-holes in a printed wiring board but is present in other areas of the board which require resistance to solder applied later in the manufacturing process.

A variety of methods are currently practiced that enable the selective final presence of solder mask or other photosensitive material. For example, solder mask is patterned to fully cover electronic circuitry except for those portions intended to be exposed, e.g., for soldering to another component. Solder masks are typically formed from photosensitive material which is applied to a substrate such as a printed circuit board. The photosensitive material is exposed to actinic radiation, which is imaged by means of an artwork or phototool. Subsequent to exposure, the photosensitive material is developed in a solvent which washes away either exposed or unexposed portions of the material (depending upon whether the photosensitive material is positive-acting or negative-acting). The portion of the material which remains on the substrate is then cured, e.g., with heat or UV light to form a hard, permanent solder mask intended to protect the printed circuitry.

One problem in the electronics industry is proper alignment or registration such as in the manufacture of multi-layer printed wiring boards. Registration is the relative position of one or more printed wiring patterns or portions thereof with respect to desired locations on a printed wiring board or another pattern on the other side of the board. One of the challenges in the manufacture of multi-layer printed wiring boards is to obtain adequate innerlayer registration. Internal features must be registered accurately to each other, and they must be accurately registered to any drilled holes. Hole-to-innerlayer misregistration creates two potential reliability problems: failure of the hole to line connection and shorts between holes and isolated conductors. Misregistration of internal layers also increases electrical resistance and decreases conductivity. Severe misregitration creates an open-circuit condition, a complete loss of continuity.

One of the last steps in the manufacture of multi-layer printed wiring boards is the application of the solder mask onto an outside layer. As mentioned above the solder mask is selectively exposed using a phototool such that specific areas can be developed off of the board. Such phototools, typically composed of diazo, silver halide or quartz and chrome, are prepared based on "idealized" dimensions of circuit line placement. However, variations in actual board dimensions of the circuit line from the "idealized" dimensions are common because of rigorous processing employed in the manufacture of the boards. Using an "idealized" phototool in combination with dynamically changing boards often results in registration problems between boards in a multi-layer laminate. Because the solder mask step is one of the last steps in the manufacture of multi-layer printed wiring boards, discarded boards caused by misregistration lead to costly and inefficient manufacturing processes.

Further, in conventional practice workers often prepare multiple fixed phototools and manually try to find the optimum fit between phototool and board to avoid misregistration. Such a process is both inaccurate and time consuming resulting in further inefficiency of multi-layer printed wiring board manufacture.

Accordingly, there is a need for improved methods of forming images on substrates.

SUMMARY OF THE INVENTION

Compositions include one or more aqueous base dispersible or aqueous base soluble compounds, one or more light-blocking agents, and pseudoviscosities of at least 10,000 cp at 25° C. and below after solvent removal or phase change of the compositions.

In another embodiment the compositions include one or more aqueous base dispersible or aqueous base soluble polymers with a molecular weight of 900 daltons and greater, one or more light-blocking agents, and pseudoviscosities of at least 10,000 cp at 25° C. and below after solvent removal or phase change of the compositions.

In a further embodiment the compositions include one or more aqueous base dispersible or aqueous base soluble polymers, one or more light-blocking agents to block out light below 500 nm, and pseudoviscosities of at least 10,000 cp at 25° C. and below after solvent removal or phase change of the compositions.

In an additional embodiment the compositions include one or more aqueous base dispersible or aqueous base soluble polymers, the one or more polymers have an acid number of 60 and greater, one or more light-blocking agents, and pseudoviscosities of at least 10,000 cp at 25° C. and below after solvent removal or phase change of the compositions.

Another embodiment is a method for forming an image including providing a substrate; applying a radiant energy sensitive material to the substrate; selectively applying a composition to the radiant energy sensitive material to form a composite substrate, the composition includes one or more aqueous base dispersible or aqueous base soluble compounds, one or more light-blocking agents, and a pseudoviscosity of at least 10,000 cp at temperatures of 25° C. and below after solvent removal or phase change; exposing the composite substrate to actinic radiation; developing away the composition and radiant energy sensitive material unexposed to the actinic radiation to form an image on the substrate. The imaged substrate may be further processed such as in the formation of multi-layer printed wiring boards or such as forming electrical circuits on the substrate by depositing metal in the spaces or channels formed by the image.

The compositions are readily removable with aqueous base. Accordingly, organic developers may be avoided in imaging methods using the compositions, thus workers are not exposed to the toxic and environmentally unfriendly organic developers used in many conventional imaging methods. Additionally, because the compositions are readily dispersible or soluble in aqueous base, not neutral or acidic solutions, they are suitable for use in humid environments. Such humid environments are common in many manufacturing plants.

The compositions have a pseudoviscosity of at least 10,000 cp at temperatures of 25° C. and below after solvent removal or phase change enabling the compositions to maintain a desired pattern on a substrate after application.

Further, registration problems, which are difficult to correct using many conventional techniques with conventional phototools, may be efficiently addressed by imaging methods using the light-blocking compositions. Such registration problems are typically found in the manufacture of multi-layer printed wiring boards where the alignment of through-holes between adjacent boards is critical to the efficient manufacture and operation of the boards in electronic devices.

DETAILED DESCRIPTION OF THE INVENTION

As used throughout this specification, the following abbreviations have the following meanings, unless the context indicates otherwise: ° C.=degrees Centigrade; gm=grams; L=liters; mL=milliliters; wt %=percent by weight; cp=centipoise; kV=kilovolts; psi=pounds per square inch; mJ=millijoules; cm=centimeters.

The terms "printed wiring board" and "printed circuit board" are used interchangeably throughout this specification. "Depositing" and "plating" are used interchangeably throughout this specification and include both electroless plating and electrolytic plating. "Multi-layer" refers to two or more layers. "Polymer" and "copolymer" are used interchangeably throughout the specification. "Radiant energy" means energy from light or heat. "Actinic radiation" means radiation from light that produces a chemical change. "(Alkyl)acrylate" includes both "acrylates" and "alkylacrylates". "Viscosity =internal fluid friction or the ratio of the shear stress to the rate of shear of a fluid. "Pseudoviscosity"=viscosity of a thixotropic substance in its most viscous state. Acid number=grams of potassium hydroxide required to neutralize 1 gm of free acids, and to measure the free acids present in a substance.

All percentages are by weight, unless otherwise noted and are based on dry weight or solvent free weight. All numerical ranges are inclusive and combinable in any order, except where it is logical that such numerical ranges are constrained to add up to 100%.

The compositions include one or more aqueous base dispersible or aqueous base soluble compounds, one or more light-blocking agents, and pseudoviscosities of at least 10,000 cp at temperatures of 25° C. and below after solvent removal or phase change of the compositions. An example of phase change is cooling of a warm melt and a hot melt. The light-blocking compositions may be employed as a mask in methods for forming an image on a substrate. The light-blocking compositions may be selectively applied to a radiant energy sensitive material. For example, a photosensitive material may be applied to a substrate, such as in the formation of a printed wiring board. A mask having the components of the light-blocking compositions may be patternwise applied to the photosensitive material by any suitable method such as a digital method. Actinic radiation is applied to the composite, which includes the substrate, photosensitive material and the patterned mask. The light-blocking agents contained in the mask block out sufficient actinic radiation from reaching the photosensitive material covered by the mask to prevent chemical alteration of the photosensitive material. For example, light may be absorbed or reflected by one or more light-blocking agents in the compositions. The photosensitive material, which is not covered by the light-blocking composition, is chemically altered. The mask is then removed with an aqueous base. Suitable aqueous base solutions have pH ranges of from 7.5 to 14, or such as from 8 to 13, or such as from 9 to 12.

The aqueous base solutions also may remove the photosensitive material, which was not exposed to the actinic radiation, or in the alternative, may remove the photosensitive material that was exposed to the actinic radiation. Typically negative-acting photosensitive material unexposed to actinic radiation is removed, and positive acting photosensitive material exposed to actinic radiation is removed. Examples of such photosensitive material include resists and inks. Resists include photoresists such as negative-acting and positive-acting photoresists, plating resists, etch or inner layer resists and solder masks.

The light-blocking compositions may include one or more compounds, which are aqueous base dispersible or aqueous base soluble. Such compounds are included in the compositions in a sufficient amount to make the compositions aqueous base dispersible or aqueous base soluble. Such compounds include, but are not limited to, compounds containing acidic functional groups, anhydride functional groups or combinations thereof. Such compounds compose from 0.1 wt % to 99 wt % or such as from 1 wt % to 90 wt %, or such as from 15 wt % to 80 wt %, or such as from 25 wt % to 60 wt % of the composition. Examples of such compounds include, but are not limited to, polymers with acidic functional groups, anhydride functional groups, and combinations thereof, and non-polymeric organic acids, anhydride containing compounds, and combinations thereof. Polymers and non-polymer compounds may be mixed together to provide the aqueous base dispersibility or aqueous base solublility.

When polymers are employed, polymers compose from 1 wt % to 99 wt % or such as from 10 wt % to 80 wt %, or such as from 25 wt % to 60 wt % of the light-blocking compositions. Any polymer or combination of polymers may be included in the compositions provided that the light-blocking compositions are aqueous base soluble or at least aqueous base dispersible. Examples of suitable polymers include, but are not limited to polyamides; polyvinylpyrrolidones and their derivatives and copolymers: polyvinylpyrrolidone, vinyl pyrrolidone and vinylacetate copolymers, alkylated polyvinylpyrrolidones, vinyl pyrrolidone and dimethylaminoethylmethacrylate copolymers, vinyl pyrrolidone-vinylcaprolactam-dimethylaminoethylmethacrylate terpolymers, vinyl pyrrolidone and styrene copolymers, and vinyl pyrrolidone and acrylic acid copolymers; methylvinylether and maleic anhydride copolymers; polyoxazolines such as poly (2-ethyl-2-oxazoline, and poly(2-ethyl-2-oxazoline)-co-(2-phenyl-2-oxazoline); polyvinyl methyl ethers; polyacrylamides; polyvinyl alcohols; polyalkoxylates; polyalkylene glycols; acid functional acrylic polymers; styrene and maleic anhydride copolymers; and thermoplastic polymeric waxes including polar waxes containing hydroxyl, amide, sulfone, phosphase, sulfonamide, urethane, carboxylic acid, amine and carbonate functional groups. Suitable derivatives of the foregoing polymers and copolymers also may be employed. Many of such polymers and copolymers are commercially available, or may readily be made by methods known in the art and literature. Such polymers typically have molecular weights of from 900 daltons and greater, or such as from 2000 to 500,000 daltons, or such as from 10,000 to 300,000 daltons, or such as from 20,000 to 100,000.

To provide aqueous base solubility or dispersibility the light-blocking compositions typically include one or more polymers with anhydride, or acid functionalities or combinations thereof in their structure. Examples of polymers having such anhydride, or acid functionality and combinations thereof include, but are not limited to, vinyl pyrrolidone and acrylic acid copolymers, methylvinylether and maleic anhydride copolymers, acid functional acrylic polymers and copolymers, and styrene and maleic anhydride copolymers, and thermoplastic waxes having acid functionalities. Typically, one or more of the foregoing polymers and copolymers with anhydride or acid functionalities are included in the light-blocking compositions. Acid numbers for such polymers range from at least 60 gm of potassium hydroxide, or such as from 70 to 350 gm of potassium hydroxide, or such as from 80 to 250 gm of potassium hydroxide, or such as from 90 to 150 gm of potassium hydroxide. Such acid and anhydride containing polymers typically compose from 10 wt % to 100 wt %, or such as from 20 wt % to 80 wt %, or such as 40 wt % to 60 wt % of the polymer component of the light-blocking compositions.

Examples of suitable non-polymeric acidic or anhydride containing compounds include, but are not limited to, octanoic acid, oxalic acid, malonic acid, tartaric acid, citric acid, benzoic acid, phthalic acid, glycolic acid, malic acid, oxalic acid, succinic acid, glutaric acid, lactic acid, salicylic acid, sebacic acid, benzenetricarboxylic acid, cyclohexane carboxylic acid, and phthalic anhydride. One or more of such compounds may be employed in amounts of from 25 wt % or less of the composition or such as from 20 wt % or less of the composition or such as from 15 wt % to 0.1 wt % of the composition or such as from 10 wt % to 1 wt % of the composition.

Any suitable light-blocking agent may be employed as long as the agent blocks out enough light to prevent photochemical alteration of the radiant energy sensitive material. For example, some light-blocking agents typically overlap the absorption spectrum of photoinitiator systems and absorb light at 400 nm and above or such as from 425 nm to 700 nm or such as from 450 nm to 500 nm. Examples of such light-blocking agents include, but are not limited to, pigments such as inorganic pigments and organic pigments, dyes, photoinitiators, and absorbers. Synthetic and natural dyes and pigments are included as well as compounds classified under "Pigment" in the color index (C.I.; published by The Society of Dyers and Colorists Company). One or more such light-blocking agents are included in the compositions in amounts such as from 0.1 wt % to 90 wt %, or such as from 1 wt % to 50 wt %, or such as from 10 wt % to 30 wt % of the light-blocking composition. One or more of the light-blocking agents is included in the compositions such that light at wavelengths of less than 500 nm is blocked, or light of less than 450 nm is blocked, or light of from 450 nm to 500 nm is blocked.

Examples of suitable inorganic pigments include, but are not limited to, iron oxides such as iron (III) oxide, zinc oxides, chromium oxides, cobalt oxides, cadmium red, barium sulfate, ultramarine blues (aluminosilicates), mixed phase titanates such as C.I. Pigment Green-Yellow PY-53, C.I. Pigment Yellow PY-53, and C.I. Pigment Red-Yellow PBr-24, mixed phase metal oxides such as C.I. Pigment Yellow PY-119, C.I. Pigment Brown PBr-29, and C.I. Pigment Brown PBr-31, titanium dioxides such as rutile and anatase, amber, and lead chromates.

Examples of suitable organic pigments include, but are not limited to, carbon black, indigo, phthalocyanine, para red, flavanoids such as red, yellow, blue, orange and ivory colors.

Examples of suitable organic dyes include, but are not limited to, azo dyes, anthraquinone, benzodifuranone, indigold, polymethine and related dyes, styryl, di- and triaryl carbonium dyes and related dyes, quinophthalones, sulfur-based dyes, nitro and nitroso dyes, stilbenes, formazans, dioxazines, perylenes, quinacridones, pyrrolo-pyrroles, isoindolines and isoindolinones.

Examples of pigments having color index (C.I.) numbers include C.I. Pigment Yellow 12, C.I. Pigment Yellow 13, C.I. Pigment yellow 14, C.I. Pigment Yellow 17, C.I. Pigment Yellow 20, C.I. Pigment Yellow 24, C.I. Pigment Yellow 31, C.I. Pigment Yellow 55, C.I. Pigment Yellow 83, C.I. Pigment Yellow 93, C.I. Pigment yellow 109, C.I. Pigment Yellow 110, C.I. Pigment Yellow 139, C.I. Pigment Yellow 153, C.I. Pigment Yellow 154, C.I. Pigment Yellow 166, C.I. Pigment Yellow 168, C.I. Pigment Orange 36, C.I. Pigment Orange 43, C.I. Pigment Orange 51, C.I. Pigment Red 9, C.I. Pigment Red 97, C.I. Pigment Red 122, C.I. Pigment Red 123, C.I. Pigment Red 149, C.I. Pigment Red 176, C.I. Pigment Red 177, C.I. Pigment Red 180, C.I. Pigment Red 215, C.I. Pigment Violet 19, C.I. Pigment Violet 23, C.I. Pigment Violet 29, C.I. Pigment Blue 15, C.I. Pigment Blue 15:3, C.I. Pigment Blue 15:6, C.I. Pigment Green 7, C.I. Pigment Green 36, C.I. Pigment Brown 23, C.I. Pigment Brown 25, C.I. Pigment Black 1 and C.I. Pigment Black 7.

Suitable absorbers include, but are not limited to, benzophenones and derivatives such as hydroxybenzophenones, benzotriazoles and derivatives such as benzotriazole carboxylic acids, triazines such as s-triazines, benzoates such as octyl-p-dimethylaminobenzoate, cinnamates such as octylmethoxycinnamate, salicylates such as octylsalicylate, crylenes such as octocrylene, cyanoacrylates such as 2-ethylhexyl 2-cyano-3,3-diphenylacrylate, malonates, oxanilides, 2-cyanoacrylates, and formamidines.

Suitable photoinitiators include, but are not limited to, hexaarylbimidazole compounds, alpha-aminoalkylphenones, acylphosphine oxides, onium salts, and aryl sulfonium salts.

In addition to the polymers and light-blocking agents described above, the light-blocking agents may optionally include other components. Such optional components include, but are not limited to, antioxidants, plasticizers, thickeners, surfactants, humectants, chelating agents, defoamers, buffers, biocides, fungicides, viscosity modifiers, bactericides, solvents such as water and organic solvents, and hydrophobic polymers and waxes such as saturated and unsaturated hydrocarbons. Optional components, such as plasticizers, thickeners, hydrophobic polymers and waxes may be used to adjust the viscosities and pseudoviscosities, mechanical properties, adhesion and abrasion resistance of the light-blocking compositions.

Plasticizers are included in amounts of from 0.5 wt % to 20 wt %, or such as from 1 wt % to 15 wt %, or such as from 5 wt % to 10 wt % of the light-blocking compositions. Examples of suitable plasticizers include ethylene vinyl acetate, phthalate esters such as dibutylphthalate, diheptylphthalate, dioctylphthalate, and diallylphthalate, glycols, such as polyethyleneglycol, and polypropyleneglycol, glycol esters such as triethylenglycoldiacetate, tetraethyleneglycoldiacetate, and dipropyleneglycoldibenzoate, phosphate esters such as tricresylphosphate, and triphenylphosphate, amides such as p-toluenesulfoneamide, benzenesulfoneamide, and N-N-butylacetoneamide, aliphatic dibasic esters such as diisobutyladipate, dioctyladipate, dimethylsebacate, dioctylazelate, and dibutylmalate, citrates such as triethylcitrate, tributylcitrate, triethylacetylcitrate, butyllaurate, dioctyl-4,5-diepoxycyclohexane-1,2-dicarboxylate, and glycerinetriacetylesters. Mixtures of the various plasticizers also may be used.

Any suitable thickener may be used. Many conventional thickeners are well known in the art. Thickeners may be included in amounts of from 0.05 wt % to 10 wt % or such as from 1 wt % to 5 wt %. Examples of suitable thickeners include, but are not limited to, bentonite and other silicate-type materials, aluminum, calcium, and zinc salts of fatty acids, such as lauric or stearic acid, and fumed silicas, or mixtures thereof.

Suitable surfactants include non-ionic surfactants, ionic surfactants such as anionic and cationic surfactants, and amphoteric surfactants, or mixtures thereof. Surfactants are included in amounts of from 0.5 wt % to 10 wt % or such as from 1 wt % to 5 wt % of the light-blocking composition.

Any suitable solvent or diluent may be employed such as water or one or more organic solvents, or mixtures thereof. Examples of organic solvents include the lower alkyl alcohols such as methyl alcohol, ethyl alcohol, propyl alcohol, ketones such as acetone and methylethyl ketone. Mixtures of water and one or more organic solvent may be employed. Generally, solvents are employed in amounts to provide desired solids formulation. Typical solids formulation range from 5 wt % to 90 wt % or such as from 10 wt % to 80 wt % or such as from 20 wt % to 70 wt %.

Any suitable thermal stabilizer may be employed. Such thermal stabilizers are used in conventional amounts and are known to those of skill in the art.

Other optional components may be included in conventional amounts, or tailored for a particular formulation by using minor experimentation.

The light-blocking compositions may be prepared by any suitable method known in the art. One method is to form a suspension or emulsion of the components. Components may be combined in any order in a suitable mixing or homogenizing apparatus. If the components are insufficiently fluid, a solvent such as water or an organic solvent may be added to the components to make them sufficiently for mixing.

During the mixing of the components the mixture may be heated to temperatures of above 25° C. to 150° C. to avoid the mixture from becoming too viscous. After the components are uniformly mixed the mixture may be cooled but not to 25° C. or below because at temperatures of 25° C. or below the light-blocking compositions typically become too viscous for application. Accordingly, the light-blocking compositions are stored in warm environments or are prepared prior to immediate use.

The light-blocking compositions may be selectively applied to a radiant energy sensitive material by any suitable means. An example of a suitable application method includes, but is not limited to, ink jetting. Examples of radiant energy sensitive material include, but are not limited to, resists and inks. Resists include photosensitive materials such as photoresists, and plating resists.

Any suitable ink-jet apparatus may be employed to selectively apply light-blocking compositions to a radiant energy sensitive material. Ink-jet apparatus may digitally store information in its memory for a selective mask design to be applied to the radiant energy sensitive material, thus the light-blocking compositions may be selectively and directly applied to the radiant energy sensitive material without intervening steps. Examples of suitable computer programs are standard CAD (computer aided design) programs for generation of tooling data. Workers may readily modify the selective deposition of the light-blocking compositions by changing the program digitally stored in the ink-jet apparatus. Additionally, registration problems also may be readily addressed. The ink jet apparatus may be programmed to perceive potential incorrect alignment between substrates, such as in the manufacture of multi-layer printed wiring boards. When the apparatus senses misregistration between boards, the program modifies the ink jet application of the mask pattern to avoid or correct misregistration between adjacent boards. The ability to re-design the mask pattern from board to board reduces the potential for misregistration between the boards, and eliminates the costly and inefficient task of preparing multiple fixed phototools. Accordingly, efficiency of selective deposition of the mask and image formation is improved over many conventional methods.

There are two major categories of ink-jet printing, "Drop-On-Demand" ink-jet and "Continuous" ink-jet. Using Drop-On-Demand ink jet technology the light-blocking composition is stored in a reservoir and delivered to a nozzle in the print head of the printer. A means exists to force a single drop of light-blocking composition out of the nozzle and onto a radiant energy sensitive material. Typically this is a piezoelectric actuation of a diaphragm within a chamber, which "pumps" the droplets out of the nozzles, or a localized heating of the fluid to increase the pressure within the chamber, thus forcing a droplet to jet. For continuous ink jet a conducting light-blocking composition is supplied under pressure to an ink nozzle and forced out through a small orifice, typically 35 µm to 80 µm in diameter. Prior to passing out of the nozzle, the pressurized light-blocking composition stream proceeds through a ceramic crystal, which is subjected to an electric current. This current causes a piezoelectric vibration equal to the frequency of AC (alternating current) electric current. This vibration, in turn, generates droplets of the composition from the unbroken stream. The composition breaks up into a continuous series of drops, which are equally spaced and of equal size. Surrounding the jet at the point where the drops separate from the liquid stream in a charge electrode a voltage is applied between the charge electrode and the drop stream. When the drops break off from the stream, each drop carries a charge proportional to the applied voltage at the instant at which it breaks off. By varying the charge electrode voltages at the same rate as drops are produced every drop may be charged to a predetermined level. The drop stream continues its flight and passes between two deflector plates, which are maintained at a constant potential such as +/−0.1 kV to +/−5 KV, or such as +/−1 kV to +/−3 kV. In the presence of this field, a drop is deflected towards one of the plates by an amount proportional to the charge carried. Drops, which are uncharged, are undeflected and collected into a gutter to be recycled to the ink nozzle. Drops, which are charged and hence deflected, impinge on a radiant energy sensitive material traveling at right angles to the direction of drop deflection. By varying the charge on individual drops, a desired pattern can be applied. Drop sizes may range from 30 µm to 100 µm, or such as from 40 µm to 80 µm, or such as from 50 µm to 70 µm in diameter.

The ink-jet processes are adaptable to computer control for high-speed application of continuously variable data. Ink jet printing methods may be divided into three general categories: high pressure (10 psi and greater), low pressure (less than 10 psi) and vacuum techniques. All are known in the art or described in the literature and can be employed in the application of the light-blocking composition to radiant energy sensitive materials.

Light-blocking compositions are applied from an ink-jet at viscosities of from 5 cp to 25 cp, or such as from 5 cp to 20 cp or such as from 10 cp to 15 cp at temperatures greater 25° C., or such as 50° C. to 250° C., or such as from 100° C. to 150° C. Pseudoviscosities of the light-blocking compositions are 10,000 cp or greater, or such as from 20,000 cp to 100,000 cp, or such as from 30,000 cp to 70,000 cp at temperatures of 25° C. or less, or such as 15° C. to 23° C. Such pseudoviscosities are after solvent removal or phase change. Typically, phase change is when the composition, as a warm melt or a hot melt, is cooled to form a firm bond. Solvents may be removed by any suitable method known in the art such as air-drying or application of heat. Warm and hot melts may undergo phase change by using any suitable method known in the art such as air-drying with cool air.

The polymers and amounts of such polymers described above also contribute to the formation of the desired viscosities and pseudoviscosities. The optional components described above also are employed to achieve the desired viscosities and pseudoviscosities. The light-blocking compositions are thin (5 cp to 25 cp) at the nozzle of an ink-jet apparatus and are thickened (10,000 cp or greater) after application on a substrate.

Any suitable aqueous base may be used to remove the masks. Such aqueous bases include, but are not limited to, aqueous alkaline solutions such as aqueous solutions of lithium, sodium and potassium hydroxide or base-reacting alkali metal salts or weak acids such as lithium, sodium, and potassium carbonates and bicarbonates. Such solutions contain alkaline agents in amounts of from 0.001 wt % to 10 wt %, or such as from 0.5 wt % to 3 wt %.

After the mask is removed along with any portions of radiant energy sensitive material, a pattern is left on the substrate. The patterned substrate may be further processed or the patterned substrate may be the completed article. In the case of solder mask, the portions of the material left on the substrate are cured by UV light or UV thermal radiation. Conventional methods may be used.

Substrates employed in electronic articles may be further processed by depositing one or more metal layers in the spaces and channels formed by the pattern. Metal or metal alloys may be deposited electrolessly, electrolytically, and by immersion. Any suitable electroless, electrolytic, and immersion bath and method may be employed to deposit metal or metal alloy layers. Many such baths are commercially available or may be readily made from the literature. Also many methods are known in the art and from the literature. Metals, which may be deposited include, but are not limited to, noble and non-noble metals and their alloys. Examples of suitable noble metals include, gold, silver, platinum, palladium and their alloys. Examples of suitable non-noble metals include, copper, nickel, cobalt, lead, iron, bismuth, zinc, ruthenium, rhodium, rubidium, indium, and their alloys.

Substrates containing metal or metal alloy deposits may be joined together, such as by lamination, to form multi-layer printed circuit boards. Various lamination processes are known in the art or described in the literature. One problem associated with the manufacture of multi-layer printed wiring boards is registration as mentioned above. Registration is the relative position of one or more printed wiring patterns or portions thereof with respect to desired locations on a printed wiring boards or another pattern on the other side of the board. One of the challenges in the manufacture of multi-layer printed wiring boards is to obtain adequate innerlayer registration. Internal features must be registered accurately to each other, and they must be accurately registered to any drilled holes. Hole-to-innerlayer misregistration creates two potential reliability problems: failure of the hole to line connection and shorts between holes and isolated conductors. Misregistration of internal layers also increases electrical resistance and decreases conductivity. Severe misregistration creates an open-circuit condition, a complete loss of continuity.

Methods of the present invention address the misregistration problem. For example application of the light-blocking compositions by ink-jet permits accurate deposition of the compositions at selective points on radiant energy sensitive material on a substrate. Such selective deposition may be repeated with reliable accuracy for multiple substrates because ink-jets may be digitally programmed for accurate repetitive application. Additionally, such programs may correct for misregistration problems by sensing misalignment and redesigning mask patterns to prevent misregistration between adjacent substrates.

In an exemplary embodiment light-blocking compositions may be selectively deposited on photoresist in the formation of a solder mask on a substrate such as a printed circuit board. Solder mask is a hard permanent layer of non-conductive material, which covers the surface of a printed circuit board encapsulating circuit traces of the printed circuit. The light-blocking compositions may be selectively applied to photoresists on printed circuit board such that the mask outlines a pattern such that the solder mask covers the circuit traces in the final article. Selective application of the light-blocking compositions may be done by ink-jetting.

Positive-acting and negative-acting photoresists may be employed as well as liquid and dry-film. For example, if the light-blocking composition is applied as a mask to a negative-acting photoresist, both the mask and the photoresist may be removed after exposure to actinic radiation with an aqueous base. If the light-blocking composition is applied as a mask to a positive-acting photoresist, both the mask and the exposed photoresist may be removed with an aqueous base. The portions of the photoresist, which remain on the substrate, may be cured using conventional methods, and the substrates may optionally be further processed according to known methods in the industry.

The light-blocking compositions and methods of mask formation may be practiced on any suitable radiant energy sensitive material. Typically such materials are coated or laminated on a substrate prior to mask formation. Examples of suitable substrates include, but are not limited to, metals, and dielectrics such as ceramics, glass, plastics, epoxy/fiberglass materials as in FR4 printed wiring boards.

The foregoing methods of mask formation using light-blocking compositions are not exhaustive. The present invention encompasses other apparatus and processes for applying light-blocking compositions to radiant energy sensitive materials and making articles.

EXAMPLE 1

Mask Formation on Negative-Acting Photoresist

A negative-acting, liquid photoresist is applied as a film via a curtain coating process to printed circuit boards. The following conditions are used: 25 gm wet coating material per square meter is applied in order to achieve a film thickness of 2 mils on the boards and 0.1 mil thickness on the copper circuitry. Coating speed is 2 meters per minute. The photoresist is dried at 90° C. for 15 minutes and cooled to room temperature.

A light-blocking composition is formulated as follows:

| Component | Wt % |
|---|---|
| Acrylic copolymer | 55 |
| Titanium dioxide | 20 |
| Carbon black | 10 |
| 1,3-Dihydroxybenzophenone | 1 |
| Polyoxyethylene (40) monostearate | 14 |

The addition polymer is prepared in accordance with the following general procedure:

A three liter flask is charged with 960 g of deionized water, placed under a nitrogen atmosphere, and heated to 85° C. A monomer emulsion consisting of 275 g 2-ethylhexyl acrylate (52 parts), 227 g methyl methacrylate (43 parts), 27 g methacrylic acid (5 parts), 1.5 g of TREM LF-40 solution (36%, Henkel Corp.), and 177 g deionized water is separately prepared. Prior to addition of this emulsion to the kettle, ammonia (24 g of a 4.8%-9.6% aqueous solution), ammonium persulfate (11 g of a 9.6% solution), and a 54 nm acrylic polymer seed (22.5 g of a 22.8% solution) are added to the kettle. The monomer emulsion is then fed to the kettle with stirring at a rate of 3.9 g/min. for 20 min. along with a solution of 24.6 g of 2.24% aqueous ammonium persulfate at a rate of 0.2 g/min., followed by 100 minutes at 6.4 and 0.20 g/min., respectively, and a hold period of 20 min. The mixture is cooled to 60° C., and a mixture of 2.6 g of 0.15% ferrous sulfate followed by 3.2 g of 4.4% t-butyl hydroperoxide and 6.1 g of 1.6% sodium formaldehyde sulfoxylate is added and held for 20 min., followed by a second identical portion of tBHP and SFS. The mixture is then cooled, filtered, and sufficient 29% aqueous ammonia is added to adjust the pH to a range of 8.0-9.0.

The acrylic copolymer in an amount of 55 gm is mixed with 1 gm of 1,3-Dihydoxybenzophenone and 14 gm of polyoxyethylene(40)monostearate in water and set aside.

20 gm of titanium dioxide and 10 gm of carbon black are dissolved in soybean oil to saturation. The titanium dioxide and carbon black are dissolved in the soybeam oil are then mixed with the components in water. The mixture is emulsified using a conventional emulsifying apparatus. A sufficient amount of water is added to the emulsified components to provide a 60 wt % solids formulation.

The light-blocking composition is placed in the reservoir of a Drop-On-Demand ink-jet apparatus. A suitable machine is the Spectra Apollo with a piezoelectric drop-on-demand inkjet head. The ink-jet apparatus is programmed for selectively applying the light-blocking composition to form a selective mask on the portions of the photoresist not covering the copper circuit traces of the printed wiring board. The light-blocking composition is jetted from the ink-jet apparatus using a high pressure technique, i.e. 50 psi.

The light-blocking composition is forced from the reservoir at 50 psi and forced out through ink-jet nozzles having orifices of 70 μm in diameter. The viscosity of the composition drops is expected to be from 5 cp to 20 cp. The temperature of the viscous light-blocking composition is reduced to 20° C. by blowing air at an ambient temperature. The composition adheres to the photoresist forming a mask over the photoresist, which is not covering the circuit traces on the board. The drops of the light-blocking composition is expected to be 10,000 cp or greater.

The composite of the board, photoresist and mask are exposed to actinic radiation having a UV energy exposure level of at least 350 mJ/cm². The mask blocks out a sufficient amount of the UV energy such that the photoresist covered by the mask is removed with an aqueous base. Exposure time is such that the portions of the photoresist exposed to the actinic radiation remain intact during application of the aqueous base.

The mask along with the unexposed photoresist is developed from the composite using an aqueous base solution of 1 wt % sodium carbonate monohydrate. A solder mask covering the copper circuit traces is left on the board. The board is laminated to one or more other boards to form a multi-layer printed wiring board.

EXAMPLE 2

Mask Formation on Positive-Acting Photoresist

A positive-acting liquid photoresist is applied as a wet film via a curtain coating process to printed circuit boards. The following coating conditions are used: 20 gm wet coating material per square meter is applied to achieve a film thickness of 3 mils on the board, and 0.1 mil thickness on the copper circuitry. Coating speed is 2 meters per minute. The photoresist is dried at 90° C. for 15 minutes and cooled to room temperature. The photoresist is then selectively coated with a light-blocking composition described below.

A light-blocking composition is prepared as follows:

| Component | Wt % |
| --- | --- |
| Methylvinylether and maleic anhydride copolymer with a molecular weight of 60,000 | 20 |
| Poly(2-ethyl-2-oxazoline) with a molecular weight of 20,000 | 20 |
| Vinyl pyrrolidone and vinylacetate copolymer with a molecular weight of 30,000 | 10 |
| Octylmethoxycinnamate | 12.5 |
| Octylsalicylate | 12.5 |
| Polyoxyethylene fatty acid ester | 25 |
| Methyl ethyl ketone | Amount sufficient to form a 10% solids composition |

The components are mixed in the methyl ethyl ketone at a temperature of 25° C. to 50° C.

The light-blocking composition is placed in the reservoir of a Drop-On-Demand ink-jet apparatus. The ink-jet apparatus is programmed for selectively applying the light-blocking composition to form a mask on the portions of the photoresist covering the copper circuit traces of the printed wiring board. The light-blocking composition is jetted from the ink-jet apparatus using a high pressure technique, i.e. 60 psi.

The light-blocking composition is forced from the reservoir at 60 psi and forced out through ink-jet nozzles having orifices of 80 μm in diameter. The viscosity of the drops is expected to be from 5 cp top 20 cp. The temperature of the viscous light-blocking composition is 75° C., and the methyl ethyl ketone solvent is driven off using a conventional hair dryer. The composition adheres to the photoresist forming a selective mask over the photoresist covering the circuit traces on the board. The ambient temperature around the board is 22° C. When the drops of light-blocking composition contact the surface of the photoresist, the pseudoviscosity of the composition is expected to be 10,000 cp or greater after solvent removal.

The composite of the board, photoresist and mask are exposed to actinic radiation having a UV energy exposure level of 300 mJ/cm². The mask blocks out a sufficient amount of the UV energy such that the positive-acting photoresist covered by the mask is not chemically altered such that it is not removed with aqueous base. Exposure time is such that the portions of the photoresist exposed to the actinic radiation are readily removed from the board with aqueous base.

The mask along with the exposed positive-acting photoresist is developed from the composite using an aqueous base solution of 1 wt % potassium carbonate. A solder mask covering the copper circuit traces is left on the board. The board may be laminated to one or more other boards to form a multi-layer printed wiring board.

EXAMPLE 3

Mask Formation on Negative-Acting Photoresist

A negative-acting, liquid photoresist is applied as a wet film via screen printing on printed circuit boards. The screen mesh is varied from 61 to 120 mesh polyester. The screened photoresist is dried at 80° C. for 30 minutes. A light-blocking composition having the formulation described below is applied as a selective mask on the photoresist.

A light-blocking composition is prepared having components as follows:

| Component | Wt % |
| --- | --- |
| Styrene and maleic anhydride copolymer having a molecular weight of 50,000 | 19 |
| Methylvinylether and maleic anhydride copolymer | 20 |
| Sorbitan sesquioleate | 10 |
| Iron (III) oxide | 20 |
| 1,3-dihydroxy benzophenone | 20 |
| 2-ethylhexyl 2-cyano-3,3-diphenylacrylate | 1 |
| 4-Benzotriazole carboxylic acid | 10 |

The above components are mixed together at a temperature of 150° C.

The light-blocking composition is placed in the reservoir of a Drop-On-Demand ink-jet apparatus. The ink-jet apparatus is programmed for applying the light-blocking composition to form a mask on the portions of the photoresist, which are not covering the copper circuit traces of the printed wiring boards. The light-blocking composition is jetted from the ink-jet using a high pressure technique, i.e., 70 psi.

The light-blocking composition is forced from the reservoir at 70 psi and forced out through ink-jet nozzles having orifices 80 μm in diameter. The viscosity of the composition drops is expected to be from 5 cp to 20 cp. The temperature of the viscous light-blocking compositions is 150° C. as it leaves the ink-jet. The composition adheres to the photoresist on the boards forming a selective mask over the photoresist at ambient temperature. The ambient temperature around the printed wiring boards is 23° C. The pseudoviscosity of the composition is expected to be 10,000 cp or greater.

The composites of the board, photoresist and mask are exposed to actinic radiation having a UV energy exposure level of at least 275 mJ/cm$^2$. The masks block out a sufficient amount of the UV energy such that the photoresist covered by the mask is removed with an aqueous base. Exposure time is such that the portions of the photoresist exposed to the actinic radiation remain on the boards during application of the aqueous base.

The masks along with the unexposed photoresist are developed from the composites using an aqueous base solution of 1 wt % sodium carbonate monohydrate. A solder mask covering the copper circuit traces is left on each board. The boards may be laminated to one or more other boards to form a multi-layer printed wiring board.

EXAMPLE 4

Mask Formulation

A light-blocking composition is formed as follows:

| Component | Wt % |
| --- | --- |
| Vinyl pyrrolidone and dimethylaminoethylmethacrylate copolymer with a molecular weight of 160,000 | 30 |
| Styrene and maleic anhydride copolymer with a molecular weight of 40,000 | 20 |
| Polyoxyethylene (20) trioleate | 15 |
| Sorbitan trioleate | 10 |
| o-Hydoxyphenyl-s-triazine | 12.5 |
| Benzophenone-1 | 12.5 |

A sufficient amount of methyl ethyl ketone is added to provide a 10% solids composition. The components of the composition are blended together at 45° C. to form a mixture. The light-blocking composition is then selectively applied as a mask as in Examples 1, 2 and 3 above to form a solder mask, which covers copper circuitry on a printed wiring board. The board may be laminated with other boards to form a multi-layer laminate.

EXAMPLE 5

Mask Formulation

The following light-blocking composition is prepared:

| Component | Wt % |
| --- | --- |
| Polyvinyl pyrrolidone with a molecular weight of 5000 | 20 |
| Methylvinylether and maleic anhydride copolymer with a molecular weight of 100,000 | 20 |
| Octylslicylate | 30 |
| Octocrylene | 10 |
| Polyoxyethylene (40)monostearate | 20 |

The components are mixed with a sufficient amount of acetone to form a 10% solids formulation at a temperature of 150° C. The light-blocking composition is then applied as a mask to form a solder mask on a printed wiring board as in Examples 1, 2 and 3. The board with the solder mask may then be laminated with other boards to form a multi-layer printed wiring board.

EXAMPLE 6

Warm Melt

The following warm melt, light-blocking composition is prepared:

| Component | Wt % |
| --- | --- |
| Polyethylene glycol | 69 |
| Acid functional acrylic polymer | 20 |
| Acid Yellow 17 | 5 |
| Hydroxybenzophenone | 5 |
| IRGANOX 1010 | 0.5 |
| Antioxidant stabilizer | 0.5 |

The components are mixed together at a temperature of 60° C. The light-blocking composition is then applied via ink-jetting at temperature of from 70° C. to 90° C. to form a solder mask on a printed wiring board substantially as described in Examples 1, 2, and 3. The board with the solder mask may then be laminated with other boards to form a multi-layer printed wiring board.

What is claimed is:

1. A method comprising:
   a) applying a radiant energy sensitive material to a substrate;
   b) selectively ink jetting a light-blocking composition to the radiant energy sensitive material on the substrate to form a composite, the light-blocking composition comprises one or more anhydride copolymers and one or more light-blocking agents chosen from benzophenones, derivatives of benzophenones, benzotriazoles, derivatives of benzotriazoles, triazines, benzoates, cinnamates, salicylates, crylenes, cyanoacrylates, formamidines, hexaarylbimidazoles, alpha-aminoalkylphenones, acylphosphine oxides, onium salts and aryl sulfonium salts;
   c) exposing the composite to actinic radiation; and
   d) applying an aqueous base to the composite to remove the light-blocking composition and portions of the radiant energy sensitive material to form a pattern on the substrate.

2. The method of claim 1, further comprising the step of depositing one or more metal layers in channels formed by the pattern on the substrate.

3. The method of claim 1, wherein the light blocking composition blocks light at wavelengths of 450 nm to 500 nm.

4. The method of claim 1, wherein the radiant energy sensitive material is a photoresist.

5. The method of claim 4, wherein exposing the photoresist to the actinic radiation cures the photoresist to form a solder-mask.

6. The method of claim 1, wherein the substrate is a printed wiring board.

7. The method of claim 1, wherein the substrate is an innerlayer for a multi-layer printed wiring board.

8. The method of claim 1, wherein the light-blocking composition further comprises one or more of dyes end pigments.

9. The method of claim 1, wherein the anhydride copolymer is a styrene and maleic anhydride copolymer.

10. The method of claim 1, further comprising polyvinylpyrrolidones, polyvinylpyrrolidone copolymers or mixtures thereof.

11. The method of claim 1, wherein the one or more anhydride copolymers have acid numbers of 70 to 350.

\* \* \* \* \*